United States Patent
Yang et al.

(10) Patent No.: US 10,600,814 B2
(45) Date of Patent: Mar. 24, 2020

(54) ARRAY SUBSTRATE, DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Anjia Yang, Beijing (CN); Lei Chen, Beijing (CN); Jiapeng Li, Beijing (CN); Shenghui Wang, Beijing (CN); Wukun Dai, Beijing (CN); Zhilong Peng, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 195 days.

(21) Appl. No.: 15/544,841

(22) PCT Filed: Jan. 5, 2017

(86) PCT No.: PCT/CN2017/070243
§ 371 (c)(1),
(2) Date: Jul. 19, 2017

(87) PCT Pub. No.: WO2017/166895
PCT Pub. Date: Oct. 5, 2017

(65) Prior Publication Data
US 2018/0166465 A1    Jun. 14, 2018

(30) Foreign Application Priority Data

Apr. 1, 2016 (CN) .......................... 2016 1 0203341

(51) Int. Cl.
*H01L 27/12* (2006.01)
*H01L 21/027* (2006.01)

(52) U.S. Cl.
CPC ........ *H01L 27/124* (2013.01); *H01L 27/1262* (2013.01); *H01L 27/1288* (2013.01);
(Continued)

(58) Field of Classification Search
None
See application file for complete search history.

(56) References Cited

U.S. PATENT DOCUMENTS

2016/0018711 A1    1/2016  Chen

FOREIGN PATENT DOCUMENTS

| CN | 102236208 A | 11/2011 |
| CN | 103336604 A | 10/2013 |

(Continued)

OTHER PUBLICATIONS

International Search Report and Written Opinion, with English Translation of Search Report and Box V of the Written Opinion, for PCT Patent Application No. PCT/CN2017/070243, dated Apr. 7, 2017, 17 pages.

(Continued)

*Primary Examiner* — Alexander G Ghyka
(74) *Attorney, Agent, or Firm* — Kinney & Lange, P.A.

(57) ABSTRACT

There are provided an array substrate, a display panel and a display device. The array substrate includes a display area and a non-display area. The non-display area include: at least one first wiring configured to be connected with a signal line within the display area and with a driver integrated circuit disposed within the non-display area; and at least one second wiring configured to cause photoresist to be uniformly distributed during a spin coating process of the photoresist.

19 Claims, 7 Drawing Sheets

(52) U.S. Cl.
CPC ...... *H01L 27/1292* (2013.01); *H01L 27/1296* (2013.01); *H01L 21/027* (2013.01)

(56) References Cited

FOREIGN PATENT DOCUMENTS

| CN | 104062789 A | 9/2014 |
| CN | 104952888 A | 9/2015 |
| CN | 105609510 A | 5/2016 |
| CN | 205679881 U | 11/2016 |

OTHER PUBLICATIONS

Second Chinese Office Action, for Chinese Patent Application No. 201610203341.8, dated Feb. 26, 2018, 12 pages.
First Chinese Office Action, for Chinese Patent Application No. 201610203341.8, dated Aug. 29, 2017, 9 pages.

ARRAY SUBSTRATE, DISPLAY PANEL AND DISPLAY DEVICE

CROSS-REFERENCE TO RELATED APPLICATION

This application is a Section 371 National Stage Application of International Application No. PCT/CN2017/070243, filed on Jan. 5, 2017, entitled "ARRAY SUBSTRATE, DISPLAY PANEL AND DISPLAY DEVICE", which has not yet published, and which claims priority to Chinese Application No. 201610203341.8, filed on Apr. 1, 2016, incorporated herein by reference in their entirety.

TECHNICAL FIELD

Embodiments of the present disclosure relate to the field of liquid crystal display technology, and particularly, to an array substrate, and a display panel and a display device in which the array substrate is applied.

BACKGROUND

During processes of manufacturing a thin film transistor (TFT) array on an array substrate of a display device, particularly during coating photoresist in a spin coating step of a photolithography process, a problem that a thickness of the photoresist is non-uniform will easily occur.

SUMMARY

In order to solve at least one of the above and other problems in prior arts, embodiments of the present disclosure provides an array substrate, a display panel and a display device, for improving distribution uniformity of photoresist on the substrate and avoiding occurrence of Track Mura during a spin coating process of the photoresist.

In an embodiment according to an aspect of the present disclosure, there is provided an array substrate, comprising a display area and a non-display area, the non-display area comprising: at least one first wiring configured to be connected with a signal line within the display area and with a driver integrated circuit disposed within the non-display area; and at least one second wiring configured to cause photoresist to be uniformly distributed during a spin coating process of the photoresist.

In the array substrate according to an embodiment of the present disclosure, the first wiring comprises a first V-shaped corner, a salient of the first V-shaped corner being directed towards the display area, and the second wiring is arranged to prevent the photoresist from accumulating towards the first V-shaped corner or to guide the photoresist flowing out from the first V-shaped corner to be dispersed.

In the array substrate according to an embodiment of the present disclosure, the second wiring comprises an auxiliary V-shaped corner, and a direction in which a salient of the auxiliary V-shaped corner protrudes is opposite to that of the salient of the first V-shaped corner.

In the array substrate according to an embodiment of the present disclosure, the auxiliary V-shaped corner comprises a second V-shaped corner located at a side of the first wiring away from the display area, and a vertex of a salient of the second V-shaped corner and a vertex of the salient of the first V-shaped corner are arranged away from each other so as to prevent the photoresist from accumulating towards the first V-shaped corner.

In the array substrate according to an embodiment of the present disclosure, the auxiliary V-shaped corner further comprises a third V-shaped corner located at a side of the first wiring adjacent to the display area, and a vertex of a salient of the third V-shaped corner and a vertex of the salient of the first V-shaped corner are arranged adjacent to each other so as to guide the photoresist flowing out from the first V-shaped corner to be dispersed.

In the array substrate according to an embodiment of the present disclosure, the second wiring has a strip shape.

In the array substrate according to an embodiment of the present disclosure, an extending direction of the second wiring is substantially perpendicular to a direction in which the salient of the first V-shaped corner protrudes.

In the array substrate according to an embodiment of the present disclosure, an extending direction of the second wiring is parallel to a side of the display area adjacent to the first wiring.

In the array substrate according to an embodiment of the present disclosure, the second wiring is located: at a side of the first wiring adjacent to the display area; and/or at a side of the first wiring away from the display area.

In the array substrate according to an embodiment of the present disclosure, the second wiring comprises: at least one continuous wiring; or at least two non-continuous wirings, two adjacent ones of which have notches staggered with one another.

In the array substrate according to an embodiment of the present disclosure, the second wiring includes a plurality of wirings parallel to one another.

In the array substrate according to an embodiment of the present disclosure, the second wiring and the first wiring are disposed in a same layer or in different layers of the array substrate.

In an embodiment according to another aspect of the present disclosure, there is provided a display panel, comprising the array substrate of any of above-described embodiments.

In an embodiment according to a further aspect of the present disclosure, there is provided a display device, comprising the display panel of the above-described embodiment.

BRIEF DESCRIPTION OF THE DRAWINGS

In order to make objects, technical solutions and advantages of the present disclosure more apparent, the present disclosure will be described in detail in conjunction with exemplary embodiments with reference to the accompanying drawings, in which.

DETAILED DESCRIPTION OF PREFERRED EMBODIMENTS

Figure 1:
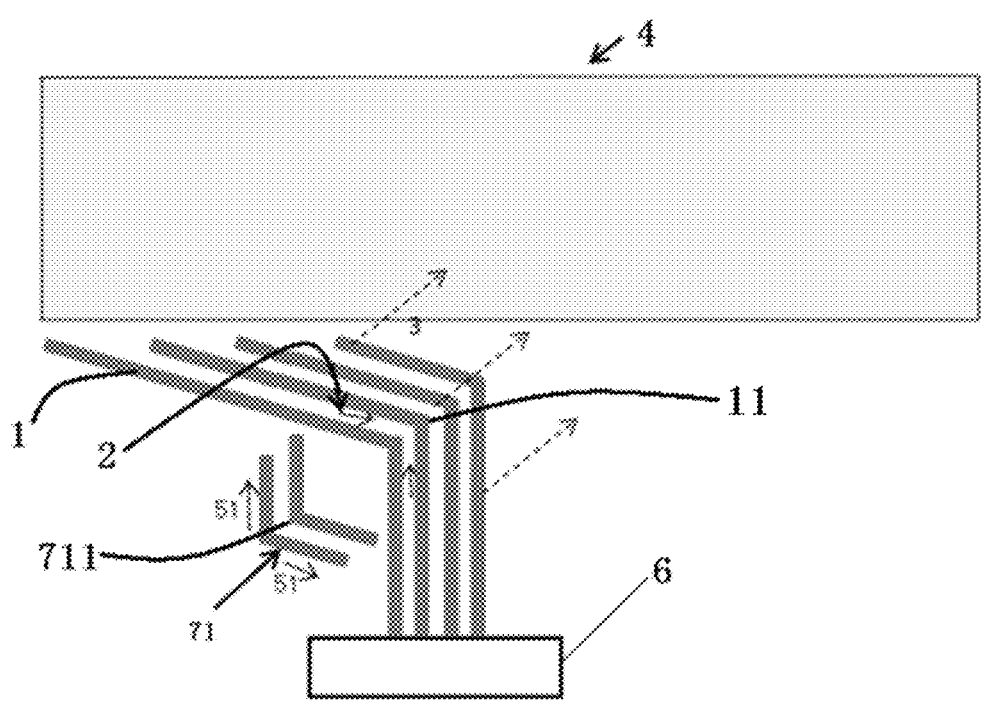
FIG. 1 is a principle schematic diagram showing a movement direction of photoresist, in a case where a second wiring, which has an orientation opposite to that of a first wiring at a V-shaped corner, is provided on an inner side of the V-shaped corner, in an array substrate according to an embodiment of the present disclosure.

Technique solutions of the present disclosure will be described in detail in conjunction with exemplary embodiments with reference to the accompanying drawings. In the description, like reference numerals refer to like elements. The following description of exemplary embodiments of the present disclosure made with reference to the accompanying drawings is intended to illustrate a general inventive concept of the present disclosure, and should not be interpreted as being limitative to the present disclosure.

According to a general inventive concept of various embodiments of the present disclosure, there are provided an array substrate, a display panel and a display device. The array substrate comprises a display area and a non-display area, and the non-display area comprises a first wiring and a second wiring. The first wiring is configured to be connected with a signal line within the display area and a driver integrated circuit disposed within the non-display area, and the second wiring is configured to cause photoresist to be uniformly distributed during a spin coating process of photoresist, thereby improving uniformity of the photoresist.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a principle schematic diagram showing a movement direction of photoresist, in a case where a second wiring, which has an orientation opposite to that of a first wiring at a V-shaped corner, is provided on an inner side of the V-shaped corner, in an array substrate according to an embodiment of the present disclosure. In a first exemplary embodiment of the present disclosure, there is provided an array substrate. Referring to FIG. 1, in this embodiment, the array substrate comprises a display area 4 and a non-display area 8 (See FIG. 7). The non-display area comprises a first wiring region and a second wiring region. The first wiring region is provided therein with a first wiring 1, which is configured to be connected with a signal line within the display area 4 and with a driver integrated circuit 6 disposed within the non-display area, and which comprises a first V-shaped corner 11.

The second wiring region is located at a side of the first wiring region away from the display area 4. The second wiring region is provided therein with a second wiring 71, which is configured to cause photoresist to be uniformly distributed during a process of coating photoresist through spin coating. The second wiring 71 comprise a second V-shaped corner 711. In an example, a vertex of a salient of the second V-shaped corner 711 and a vertex of a salient of the first V-shaped corner 11 are arranged facing away from each other.

In the array substrate of the above embodiment, the second wiring is provided such that photoresist may be uniformly distributed during coating photoresist through a spin coating process, which prevents or reduces any excessive difference in thickness of photoresist within partial regions and avoids or mitigates occurrence of Track Mura, thereby improving quality of the formed first wiring.

In an embodiment, the first wiring 1 comprises a first V-shaped corner 11, a salient of which is directed towards the display area 4. During coating photoresist through spin coating to form the first wiring 1 in a photolithography process, the second wiring 71 is provided to prevent the photoresist from accumulating towards the first V-shaped corner 11. In such a manner, the photoresist may be uniformly distributed during a spin coating process of photoresist.

In an embodiment, the second wiring 71 comprises an auxiliary V-shaped corner, and a direction of a salient of the auxiliary V-shaped corner protrudes is opposite to that of the salient of the first V-shaped corner 11. In an example, the auxiliary V-shaped corner comprises a second V-shaped corner 711 located at a side of the first wiring 1 away from the display area 4. A vertex of the salient of the second V-shaped corner 711 and a vertex of the salient of the first V-shaped corner 11 are arranged facing away from each other so as to prevent the photoresist from accumulating towards the first V-shaped corner.

During a spin coating process of photoresist, photoresist is dripped down at a center position of a substrate, then a base drives the substrate to rotate at a high speed, so that the photoresist is uniformly spin-coated from the inside out over a surface of the substrate. FIG. 1 shows a movement direction 2 of the photoresist at the first V-shaped corner 11 fanning out from the first wiring 1 during a photolithography spin coating of photoresist. As shown in FIG. 1, during a photolithography spin coating of photoresist for manufacturing an array substrate, the first wiring 1 is a Fan-out structure and comprises the first V-shaped corner 11. Under a combined effect of a centrifugal force and the first V-shaped corner during spin coating of photoresist, there is a trend that photoresist located within some regions of the array substrate tends to move towards the first V-shaped corner 11, and a movement direction of the photoresist is denoted by reference numeral 2 in FIG. 1. In this case, there will be more photoresist along a line parallel to a direction to which the first V-shaped corner 11 is directed than on either side thereof, the photoresist will be thrown towards the display area 4 at an end of the first V-shaped corner in a direction denoted by reference numeral 3, so that there is a difference in thickness of the photoresist in partial regions. The thickness of the photoresist located at positions outside the first V-shaped corner in the direction to which the first V-shaped corner is directed is obviously larger than that of the photoresist located within other regions, resulting in a non-uniform thickness of the photoresist.

In the array substrate according to this embodiment, the second V-shaped corner 711 of the second wiring 71 has an orientation opposite to that of the first V-shaped corner 11 so as to guide parts of the photoresist to move in a direction away from a center of the first V-shaped corner 11, the movement direction of the photoresist is indicated by reference numeral 51, and the movement has an guiding effect opposite to the first V-shaped corner, preventing the photoresist at the end of the first V-shaped corner from accumulating in the direction denoted by the reference numeral 3 due to the first V-shaped corner, and thereby avoiding the photoresist from being non-uniformly coated. Thereby, the second wiring is designed such that the photoresist is guided towards two sides by the second wiring, avoiding excess deposition of the photoresist within the display area due to guiding effect of the first wiring, enabling the photoresist being uniformly distributed.

It is noted that in this embodiment, two second wirings 71 are arranged within the second wiring regions, the present disclosure, however, is not limited to this. In other embodiments of the present disclosure, there may be one second wiring or a plurality of second wirings, for example, three, four or five second wirings, or the like.

Figure 7:
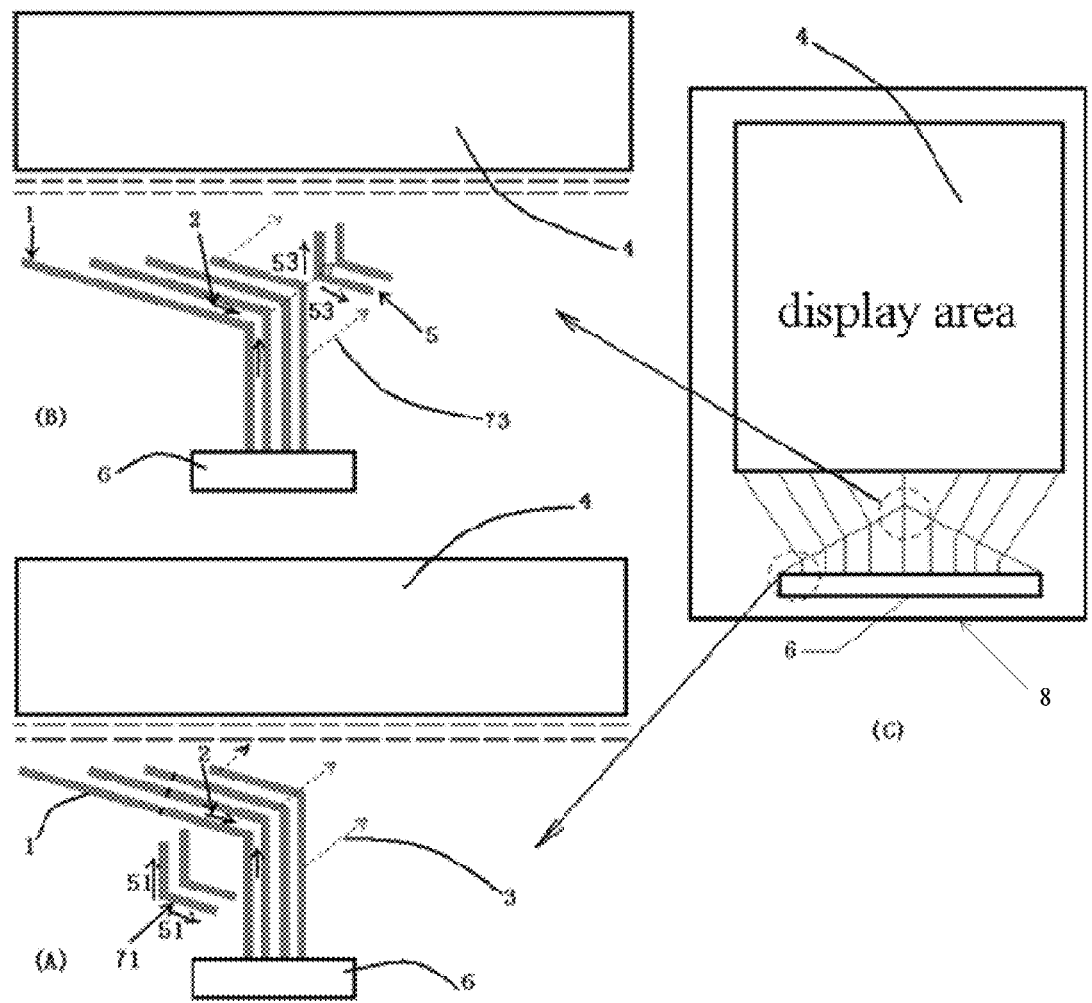
FIG. 7 is a schematic diagram showing a general distribution of a driver integrated circuit, a first wiring, a second wiring and a display area of an array substrate according to an embodiment of the present disclosure, where parts (A) and (B) show enlarged views of a dashed circle portion in part (C).

The case described in this embodiment is shown in part (A) of FIG. 7, where on basis of a layout of the first wiring, the second wiring 71, which has an orientation opposite to that of the wiring at the first V-shaped corner 11, is added at position close to a starting end of a trend line of the first V-shaped corner 11 of the first wiring 1 within the first wiring region, so as to guide parts of the photoresist to move in a direction away from a center of the first V-shaped corner 11, the movement direction of the photoresist being indicated by reference numeral 51.

Figure 2:
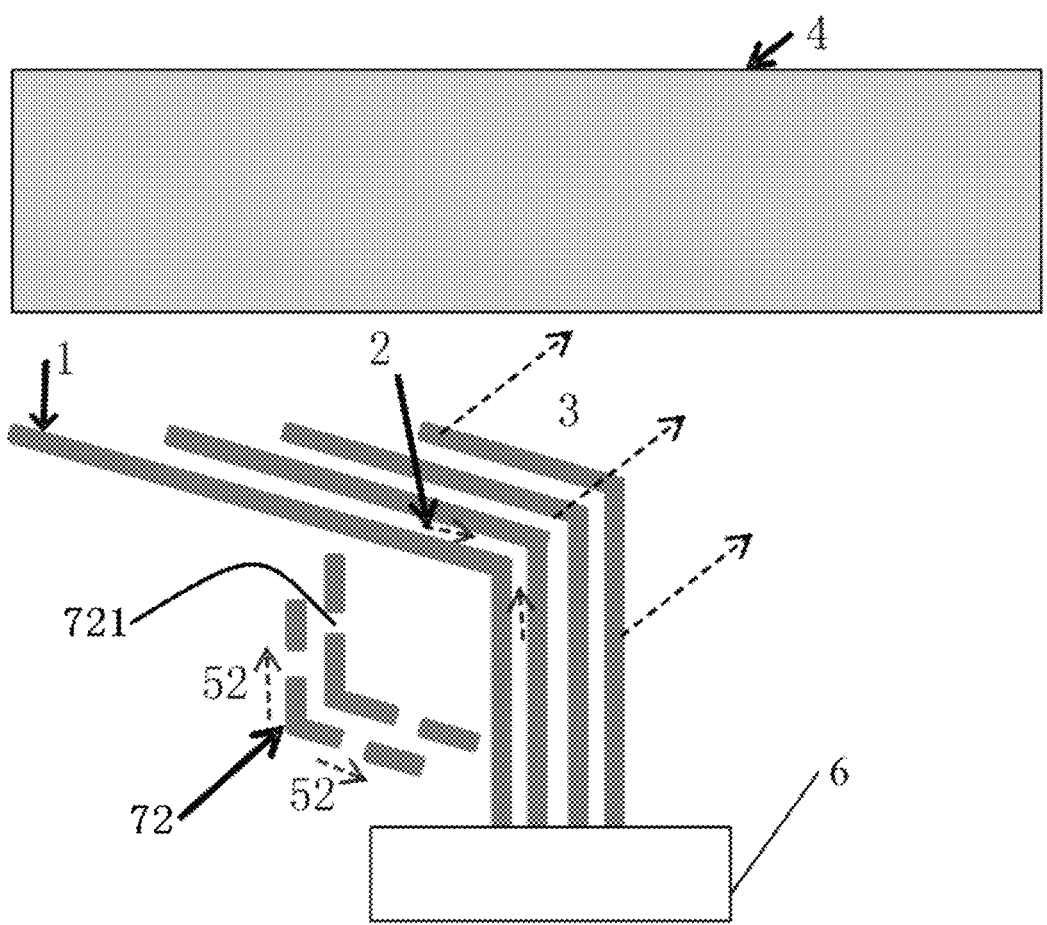
FIG. 2 is a principle schematic diagram showing a movement direction of photoresist, in a case where a non-continuous second wiring is used in an array substrate according to another embodiment of the present disclosure.

FIG. 2 is a principle schematic diagram showing a movement direction of photoresist, in a case where a non-continuous second wiring is used in an array substrate according to another embodiment of the present disclosure. The array substrate shown in FIG. 2 is different from the array substrate shown in FIG. 1 in the second wiring. Referring to FIG. 2, in the array substrate according to this embodiment, the second wiring 72 is arranged to be non-continuous. The second wiring 72 also comprises a second V-shaped corner. Parts in FIG. 2 which are the same as those in FIG. 1 are denoted by the same reference numerals.

In this embodiment, corresponding parts of two second wirings 72 are parallel to each other, and the two non-continuous second wiring 72 comprise notches 721 staggered with one another, that is, there is no notch at a position of a first one of the second wirings corresponding to a position of the notch 721 of a second one of the second wirings. In this case, even if the photoresist is thrown towards the display area 4 from the notches of the first outer one of the second wirings, it will be blocked by the second inner one of the second wirings and will not be finally thrown to the display area 4. In the drawings, the movement direction of the photoresist is indicated by reference numeral 52 in FIG. 2.

Figure 3:
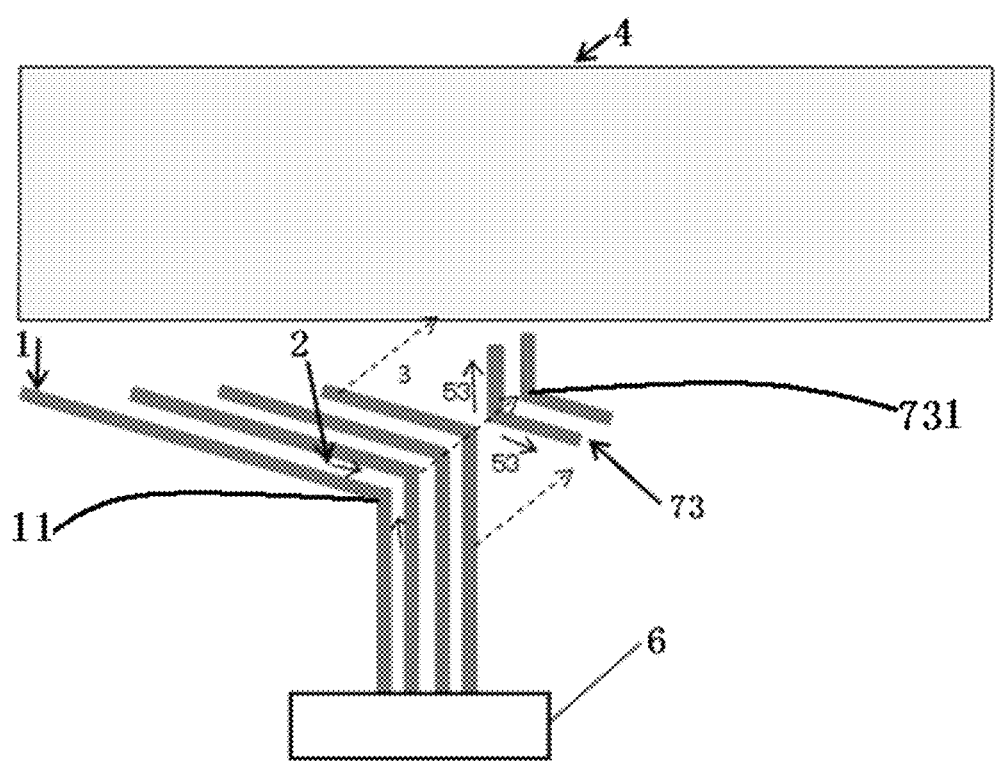
FIG. 3 is a principle schematic diagram showing a movement direction of photoresist, in a case where a second wiring, which has an orientation opposite to that of a first wiring at a V-shaped corner, is provided at an outer side of the V-shaped corner, in an array substrate according to a further embodiment of the present disclosure.

FIG. 3 is a principle schematic diagram showing a movement direction of photoresist, in a case where a second wiring, which has an orientation opposite to that of a first wiring at a V-shaped corner, is provided at an outer side of the V-shaped corner, in an array substrate according to a further embodiment of the present disclosure. Referring to FIG. 3, in this embodiment, a second wiring region may be located at a side of the first wiring region adjacent to the display area 4, and a continuous second wiring 73 is arranged within the second wiring region. The auxiliary V-shaped corner further comprises a third V-shaped corner 731 at a side of the first wiring 1 adjacent to the display area 4, and a vertex of a salient of the third V-shaped corner 731 and the vertex of the salient of the first V-shaped corner are arranged adjacent to each other so as to guide the photoresist flowing out from the first V-shaped corner to be dispersed.

In other words, the array substrate shown in FIG. 3 is different from the array substrate shown in FIG. 1 in the second wiring 73 located at a side of the first wiring 1 adjacent to the display area 4. The vertex of the salient of the third V-shaped corner 731 and the vertex of the salient of the first V-shaped corner are arranged adjacent to each other.

In this embodiment, on basis of the first wiring 1, the second wiring 73, which has an orientation opposite to that of the first V-shaped corner 11, is added at an outer side the first V-shaped corner 11 so as to guide parts of the photoresist to move in a direction away from a center of the first V-shaped corner 11, as indicated by reference numeral 53 in FIG. 3. In such a manner, by providing the second wiring 73 having the third V-shaped corner 731, the photoresist which would otherwise be guided by the first V-shaped corner and accumulate will be guided to be dispersed towards two sides of the corner of the second wiring 73, so that the photoresist may be uniformly distributed during the spin coating process of photoresist.

The case described in this embodiment is shown in part (B) of FIG. 7, where on basis of the layout of the first wiring, the second wiring 73, which has an orientation opposite to that of the wiring at the first V-shaped corner 11, is added at a position closed to a starting end of a trend line of the first V-shaped corner 11 of the first wiring 1 within the first wiring region, so as to guide parts of the photoresist, which would otherwise be guided by the first V-shaped corner and accumulate, to be dispersed towards two sides of the corner of the second wiring 73, the movement direction of the photoresist being indicated by reference numeral 53.

It would be appreciated that the second wiring 73 in FIG. 3 may be arranged to be non-continuous. In an embodiment, corresponding parts of two second wirings 73 are parallel to each other, and the two non-continuous second wiring 73 comprise notches staggered with one another, that is, there is no notch at a position of a first one of the second wirings corresponding to a position of the notch of a second one of the second wirings.

Figure 4:
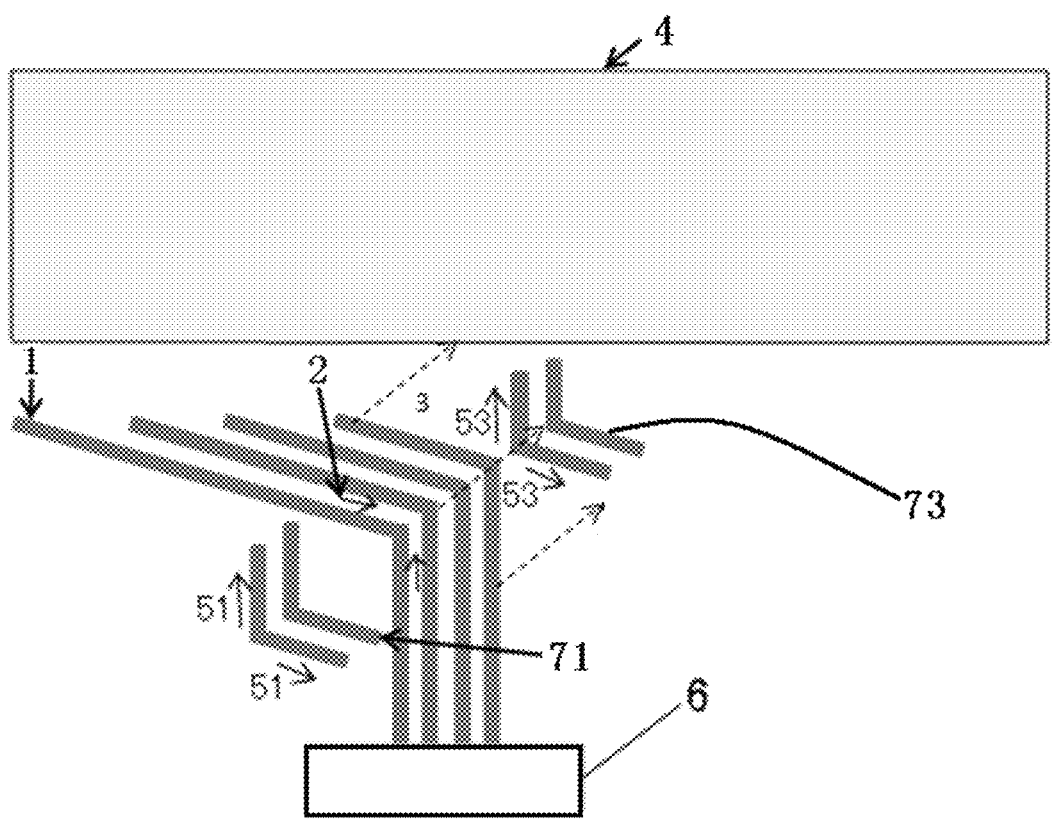
FIG. 4 is a principle schematic diagram showing a movement direction of photoresist, in a case where second wirings, each of which has an orientation opposite to that of a first wiring at a V-shaped corner, are provided on inner and outer sides of the V-shaped corner respectively, in an array substrate according to a still further embodiment of the present disclosure.

FIG. 4 is a principle schematic diagram showing a movement direction of photoresist, in a case where second wirings, each of which has an orientation opposite to that of a first wiring at a V-shaped corner, are provided on inner and outer sides of the V-shaped corner respectively, in an array substrate according to a still further embodiment of the present disclosure. Referring to FIG. 4, this embodiment combines solutions of the first and second embodiments and includes two sets of second wirings 71 and 73. In an example, one set of second wirings 71 is located at a side of the first wiring 1 away from the display area 4, and a vertex of a salient of the second V-shaped corner of each of two second wirings 71 of the set of second wirings and the vertex of the salient of the first V-shaped corner are arranged facing away from each other. The other set of second wirings 73 is located at a side of the first wiring 1 adjacent to the display area 4, and a vertex of a salient of the third V-shaped corner of each of two second wirings 73 of the other set of second wirings and the vertex of the salient of the first V-shaped corner 11 are arranged adjacent to each other.

In this embodiment, the second V-shaped corner of the second wiring 71 located at an inner side of the first wiring 1 has an orientation opposite to that of the first V-shaped corner of the first wiring 1, such that it may guide parts of the photoresist to move in a direction away from a center of the first V-shaped corner 11, the movement direction of the photoresist is indicated by reference numeral 51, and this movement has an guiding effect opposite to the first V-shaped corner and may prevent the photoresist at the end of the first V-shaped corner from accumulating in the direction denoted by the reference numeral 3 due to the first V-shaped corner; on the other hand, the second wiring 73 located at an outer side of the first wiring 1 guides the photoresist, which would otherwise be guided by the first V-shaped corner and accumulate, to be dispersed towards two sides of the second wiring, the movement direction of the photoresist is indicated by reference numeral 53, and the movement may avoid the photoresist from being non-uniformly coated.

As such, the two sets of second wirings 71 and 73 function to guide the photoresist in a better effect opposite to the first V-shaped corner, and movement directions of the photoresist under guiding effect of the two sets of second wirings 71 and 73 are indicated by reference numerals 51 and 53 shown in FIG. 4. Compared to the first and second embodiments, the uniformity of the photoresist located within a region of the display area 4 corresponding to the first V-shaped corner will be further improved.

As can be seen that in each of the four above described embodiments, the second wiring 71, 72 and/or 73, which has an orientation opposite to a wiring orientation of the first V-shaped corner 11 of the first wiring 1, are/is added, so as to provide an opposite effect in guiding the photoresist with respect to the first V-shaped corner, thereby reducing defects in spin coating caused by conventional designs, decreasing an excessive difference in thickness of photoresist during spin coating, improving the uniformity of the photoresist located within a region of the display area 4 corresponding to the V-shaped greatly, and avoiding or mitigating occurrence of Track Mura.

Figure 5:
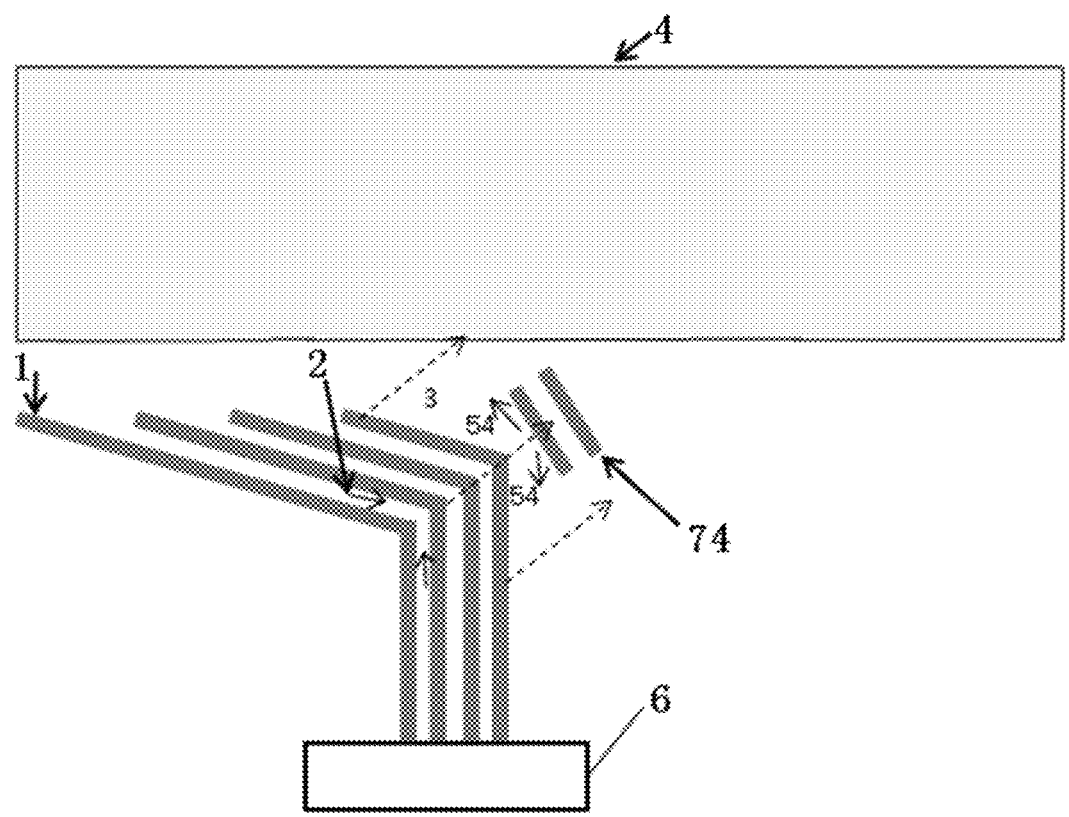
FIG. 5 is a principle schematic diagram showing a movement direction of photoresist, in a case where a second wiring, which is perpendicular to a direction in which a V-shaped corner is oriented, is provided at an outer side of the V-shaped corner, in an array substrate according to a yet another embodiment of the present disclosure.

FIG. 5 is a principle schematic diagram showing a movement direction of photoresist, in a case where a second wiring, which is perpendicular to a direction in which a V-shaped corner is oriented, is provided at an outer side of the V-shaped corner, in an array substrate according to yet another embodiment of the present disclosure. Referring to FIG. 5, in this embodiment, the second wiring 74 is located at a side of the first wiring 1 adjacent to the display area, at a position downstream in the direction in which a V-shaped corner is oriented. The second wiring has a strip shape, and an extending direction of the second wiring 74 is perpendicular to a direction in which first V-shaped corner protrudes.

In this embodiment, the second wiring 74, which is perpendicular to the direction in which first V-shaped corner protrudes, is provided at a position close to an end of the first V-shaped corner and functions to block the photoresist which would otherwise be guided by the first V-shaped corner and accumulate, and to prevent the photoresist from being intensively accumulated within some regions of the display area 4, thereby avoiding the photoresist from being non-uniformly coated. Here, the movement direction of the photoresist under guiding effect of the second wiring is indicated by reference numeral 54 shown in FIG. 5.

Figure 6:
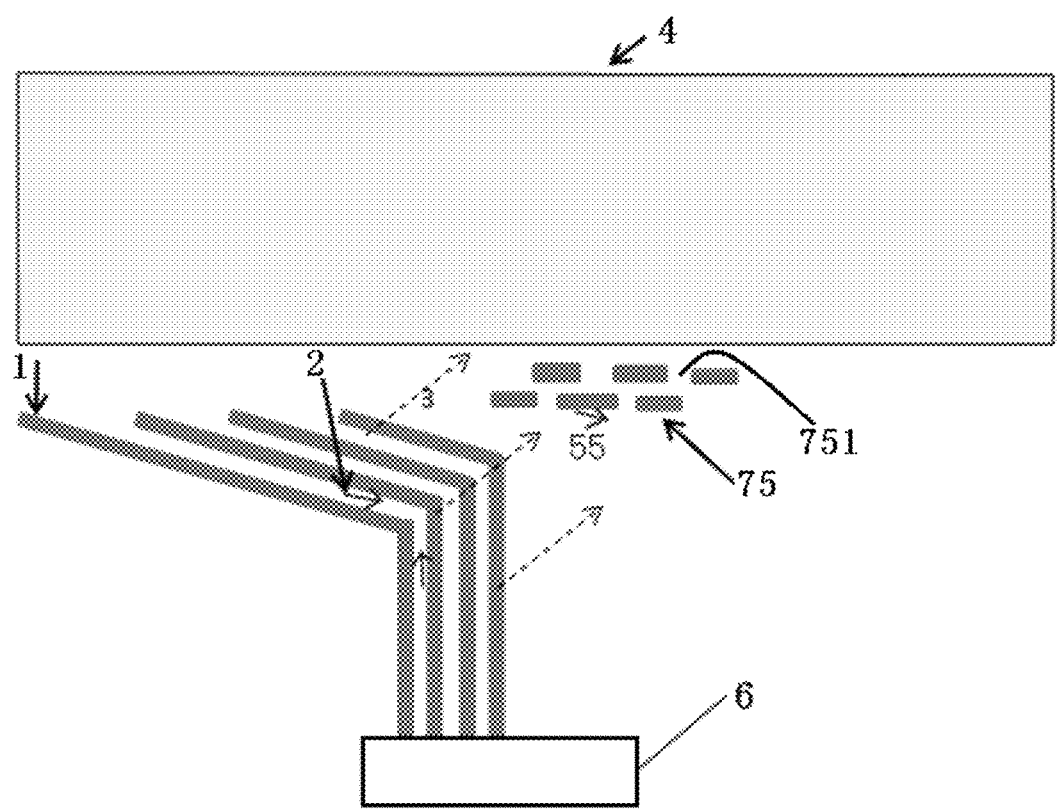
FIG. 6 is a principle schematic diagram showing a movement direction of photoresist, in a case where a second wiring, which is parallel to a border of a display area, is provided at an outer side of a V-shaped corner, in an array substrate according to a yet further embodiment of the present disclosure.

FIG. 6 is a principle schematic diagram showing a movement direction of photoresist, in a case where a second wiring, which is parallel to a border of a display area, is provided at an outer side of a V-shaped corner, in an array substrate according to a yet further embodiment of the present disclosure. Referring to FIG. 6, in this embodiment, the second wiring 75 is arranged in a non-continuous strip shape. A direction in which the second wiring 75 extends is parallel to a side of the display area 4 adjacent to the first wiring 1, and the second wiring 75 is located at a side of the first wiring 1 adjacent to the display area 4. In other words, the second wiring 75 is located downstream relative to the first wiring 1 in the direction in which the first V-shaped corner is oriented. Corresponding parts of two second wirings 75 are parallel to each other, and the two non-continuous second wiring 75 comprise notches 751 staggered with one another, that is, there is no notch at a position of a first one of the second wirings corresponding to a position of the notch 751 of a second one of the second wirings. In this case, the movement direction of the photoresist under guiding effect of the second wiring 75 is indicated by reference numeral 55 in FIG. 6. The second wiring 75 functions to block the photoresist which would otherwise be guided by the first V-shaped corner of the first wiring 1 and accumulate, and to prevent the photoresist from being intensively accumulated within some regions of the display area 4, thereby avoiding the photoresist from being non-uniformly coated. In many embodiments as described above, there may be a plurality of second wirings, each of which may have a non-continuous structure as described in the above embodiments, and notches of the parallel and adjacent second wirings are staggered with one another.

In the embodiments shown in FIGS. 5 and 6, the second wirings 74 and 75 are each arranged in a strip shape, rather than in a V-shaped corner shape, such designed second wiring may reduce amount of the photoresist which would otherwise enter the display area from a position where the second wiring is located during spin coating, and may also achieve an effect of reducing any excessive difference in thickness of photoresist within partial regions during spin coating and reducing defects in spin coating caused by conventional designs, such that uniformity of the photoresist located within a region of the display area 4 corresponding to the V-shaped greatly can be improved and occurrence of Track Mura can be avoided or mitigated.

It will be understood by those skilled in the art that the strip shaped second wiring shown in FIGS. 5 and 6 may be utilized in combination with the second wiring having the corner and located at the inner or outer side of the first wiring shown in FIGS. 1 and 2.

FIG. 7 is a schematic diagram showing a general distribution of a driver integrated circuit, a first wiring, a second wiring and a display area of an array substrate according to an embodiment of the present disclosure, where parts (A) and (B) show enlarged views of a dashed circle portion in part (C), and a dashed line shown in this figure represents extension of the first wiring. One specific application of the present disclosure will be described with reference to FIG. 7.

Taking a data signal wiring as an example, referring to a schematic diagram (C) on right side in FIG. 7, data signal wirings are leaded out from a driver integrated circuit 6 in a parallel way, and some first wirings 1 will form corners within a fan-out region before entering the display area 4 so as to form the first V-shaped corners described in above embodiments, then the first wirings extend to an border of the display area, and electrically connect with data signal lines via vias.

According to the above embodiments of the present disclosure, a second wiring, which has an orientation opposite to a direction in which the first V-shaped corner 11 protrudes, may be provided at an inner side of the first V-shaped corner, that is, at a side of the first V-shaped corner adjacent to the driver integrated circuit 6, as indicated by reference numeral 51 in the figure. In addition, a second wiring, which has an orientation opposite to a direction in which the first V-shaped corner 11 protrudes, may be also provided at an outer side of the first V-shaped corner, that is, at a side of the first V-shaped corner adjacent to the display area 4, as indicated by reference numeral 53 in the figure.

It is noted that in the above embodiments, the second wiring and the data signal line may be arranged in the same layer or in different layers, as long as they are formed before manufacturing a layer of transparent conductive film, and design solutions may be determined according to sizes of wirings and wiring space. Non-uniform distribution of photoresist will adversely affect various functional layers, especially, a layer of transparent conductive film to be used as a common electrode or display electrode. If the layer of transparent conductive film is adversely affected, display defects will be generated in a display screen. Thus, it will be very necessary to apply technique solutions of the present disclosure before depositing the layer of transparent conductive film, such that the photoresist is uniformly distributed. Also, it can be understand that the second wiring and the data signal wiring may be located in different layers of the array substrate.

Although description has been made in the above embodiments only by an example where the first wiring is electrically connected with the data signal wiring, this is also applicable to the case where the first wiring is electrically connected with a gate signal wiring.

In addition, it is noted that in above embodiment, the embodiments of the present disclosure are only exemplarily described. In other embodiments of the present disclosure, a wiring having an actual function may be used as the second wiring. Further, the second wiring may be remained or removed in subsequent process(es). In addition to the first wiring, if a similar problem occurs in any other wiring having a specific function during the spin coating process of photoresist, technique solutions of the present disclosure may also be applied to solve the problem.

According to an exemplary embodiment of another aspect of the present disclosure, there is further provided a display panel. The display panel may comprise the array substrate described in any one of above respective embodiments.

According to an exemplary embodiment of a further aspect of the present disclosure, there is further provided a display device. The display device comprises the display panel described in the above embodiment. The display device may be a mobile phone, a tablet computer, a TV set, a display, a notebook PC, a digital picture frame, a navigator, an electronic paper or any other product or component having a display function.

It will be appreciated by those skilled in the art that the position of the second wiring may be adjusted as required, and is not limited to those described in the above embodiments; the width, the number or the like of the second wiring may also be adjusted as required. Directional terms used in embodiments, for example, "upper", "lower", "front", "rear", "left", "right" and the like, are only directions described with respect to figures, and are not intended to limit the scope of the present disclosure. Further, on basis of considerations of design and reliability, the above embodiments may be randomly combined with each other, or may be combined with other embodiments, that is, technical features in different embodiments may be freely combined to form more embodiments.

In sum, with the array substrate, the display panel and the display device according to respective embodiments of the present disclosure, the second wiring is provided to guide the photoresist toward two sides of the first wiring, so that the photoresist can be avoided from being excessively deposited within a region of the display area at an outer side of the V-shaped corner, the uniformity of the photoresist can be improved, and any excessive difference in thickness of photoresist within partial regions, which may otherwise be caused by non-uniformly spin-coated photoresist due to conventional designs can be prevented or reduced, thereby avoiding or mitigating occurrence of Track Mura.

Objects, technique solutions and advantageous effects of the present disclosure have been described in detail in the above exemplary embodiments. It should be appreciated that the above described contents are only exemplary embodiments of the present disclosure, and are not intended to limit the present disclosure. Various changes, equivalents or modifications made without departing from the principles and spirit of the disclosure will fall within the scope of the present disclosure.

What is claimed is:

1. An array substrate, comprising a display area and a non-display area, the non-display area comprising:
    at least one first wiring configured to be connected with a signal line within the display area and with a driver integrated circuit disposed within the non-display area; and
    at least one second wiring configured to cause photoresist to be uniformly distributed during a spin coating process of the photoresist,
    wherein the first wiring comprises a first V-shaped corner, a salient of the first V-shaped corner being directed towards the display area, and the second wiring is arranged to prevent the photoresist from accumulating towards the first V-shaped corner or to guide the photoresist flowing out from the first V-shaped corner to be dispersed.

2. The array substrate according to claim 1, wherein the second wiring comprises an auxiliary V-shaped corner, and a direction in which a salient of the auxiliary V-shaped corner protrudes is opposite to that of the salient of the first V-shaped corner.

3. The array substrate according to claim 2, wherein the auxiliary V-shaped corner comprises a second V-shaped corner located at a side of the first wiring away from the display area, and a vertex of a salient of the second V-shaped corner and a vertex of the salient of the first V-shaped corner are arranged away from each other so as to prevent the photoresist from accumulating towards the first V-shaped corner.

4. The array substrate according to claim 2, wherein the auxiliary V-shaped corner further comprises a third V-shaped corner located at a side of the first wiring adjacent to the display area, and a vertex of a salient of the third V-shaped corner and a vertex of the salient of the first V-shaped corner are arranged adjacent to each other so as to guide the photoresist flowing out from the first V-shaped corner to be dispersed.

5. The array substrate according to claim 1, wherein the second wiring has a strip shape.

6. The array substrate according to claim 5, wherein an extending direction of the second wiring is substantially perpendicular to a direction in which the salient of the first V-shaped corner protrudes.

7. The array substrate according to claim 5, wherein an extending direction of the second wiring is parallel to a side of the display area adjacent to the first wiring.

8. The array substrate according to claim 6, wherein the second wiring is located:
- at a first side of the first wiring adjacent to the display area; and/or
- at a second side of the first wiring away from the display area.

9. The array substrate according to claim 2, wherein the second wiring comprises:
- at least one continuous wiring; or
- a plurality of non-continuous wirings, two adjacent ones of which have notches staggered with one another.

10. The array substrate according to claim 9, wherein the second wiring comprises a plurality of wirings parallel to one another.

11. The array substrate according to claim 1, wherein the second wiring and the first wiring are disposed in a same layer or in different layers of the array substrate.

12. A display panel, comprising the array substrate of claim 1.

13. A display device, comprising the display panel of claim 12.

14. The array substrate according to claim 3, wherein the auxiliary V-shaped corner comprises a third V-shaped corner located at a side of the first wiring adjacent to the display area, and a vertex of a salient of the third V-shaped corner and a vertex of the salient of the first V-shaped corner are arranged adjacent to each other so as to guide the photoresist flowing out from the first V-shaped corner to be dispersed.

15. The array substrate according to claim 7, wherein the second wiring is located:
- at a first side of the first wiring adjacent to the display area; and/or
- at a second side of the first wiring away from the display area.

16. The array substrate according to claim 3, wherein the second wiring comprises:
- at least one continuous wiring; or
- a plurality of non-continuous wirings, two adjacent ones of which have notches staggered with one another.

17. The array substrate according to claim 4, wherein the second wiring comprises:
- at least one continuous wiring; or
- a plurality of non-continuous wirings, two adjacent ones of which have notches staggered with one another.

18. The array substrate according to claim 6, wherein the second wiring comprises:
- at least one continuous wiring; or
- a plurality of non-continuous wirings, two adjacent ones of which have notches staggered with one another.

19. The array substrate according to claim 7, wherein the second wiring comprises:
- at least one continuous wiring; or
- a plurality of non-continuous wirings, two adjacent ones of which have notches staggered with one another.

* * * * *